US012751230B2

(12) United States Patent
Yulaev et al.

(10) Patent No.: US 12,751,230 B2
(45) Date of Patent: Sep. 29, 2026

(54) PHOTONIC INTEGRATED CIRCUIT CHIP FACET PREPARATION VIA LASER-BASED DICING

(71) Applicant: IonQ, Inc., College Park, MD (US)

(72) Inventors: Alex Yulaev, Germantown, MD (US); James Walker Steere, College Park, MD (US); Kang Tan, College Park, MD (US); Jeremy Matthew Sage, Acton, MA (US)

(73) Assignee: IonQ, Inc., College Park, MD (US)

( * ) Notice: Subject to any disclaimer, the term of this patent is extended or adjusted under 35 U.S.C. 154(b) by 80 days.

(21) Appl. No.: 18/888,707

(22) Filed: Sep. 18, 2024

(65) Prior Publication Data

US 2025/0091163 A1 Mar. 20, 2025

Related U.S. Application Data

(60) Provisional application No. 63/583,773, filed on Sep. 19, 2023.

(51) Int. Cl.

| | |
|---|---|
| ***H10P 54/20*** | (2026.01) |
| ***H10P 54/92*** | (2026.01) |
| ***H10P 58/00*** | (2026.01) |

(52) U.S. Cl.

CPC ............ *H10P 54/20* (2026.01); *H10P 54/924* (2026.01); *H10P 58/00* (2026.01)

(58) Field of Classification Search

CPC ........ H10P 54/20; H10P 54/924; H10P 58/00; B23K 26/53

See application file for complete search history.

(56) References Cited

U.S. PATENT DOCUMENTS 11,158,601 B2 * 10/2021 Sakamoto .............. B23K 26/00
12,599,989 B2 * 4/2026 Nakamura ............. B23K 26/53
(Continued)

FOREIGN PATENT DOCUMENTS

CN 116072513 A * 5/2023 .............. H10P 90/12
CN 117457486 A * 1/2024 .......... H10P 72/7402
(Continued)

OTHER PUBLICATIONS

Jankowski et al., "Ultrabroadband Nonlinear Optics in Nanophotonic Periodically Poled Lithium Niobate Waveguides", Research Article, Optica, arXiv:1909.08806v1 [physics.optics], Sep. 2019, 9 pages.

*Primary Examiner* — David A Zarneke
(74) *Attorney, Agent, or Firm* — ARENTFOX SCHIFF LLP

(57) ABSTRACT

Aspects of the present disclosure relate generally to systems and methods for use in the implementation and/or operation of preparing photonic integrated circuits (PICs). Specifically, the method include coupling a dicing tape to a first side of a wafer. The method also includes performing a first laser processing step to form a modified layer by applying at least one laser beam of a wavelength that has transmissivity through the wafer along a first projected dicing line to define a first facet and performing a second laser processing step to form the modified layer by applying the at least one laser beam to the wafer along a second projected dicing line to define a second facet. The method further includes expanding the dicing tape to divide the wafer from the modified layer along at least the first projected dicing line and the second projected dicing line into PIC chips.

7 Claims, 16 Drawing Sheets

500c

500d

(56) References Cited

U.S. PATENT DOCUMENTS

| | | | | |
|---|---|---|---|---|
| 2018/0102288 | A1* | 4/2018 | Bae | B23K 26/0006 |
| 2019/0030648 | A1* | 1/2019 | Priewasser | B23K 26/364 |
| 2019/0363018 | A1* | 11/2019 | Seddon | B23K 20/10 |
| 2024/0181562 | A1* | 6/2024 | Mori | B23K 26/0622 |
| 2024/0363413 | A1* | 10/2024 | Lin | H10P 54/00 |
| 2025/0006501 | A1* | 1/2025 | Zhang | B23K 26/354 |

FOREIGN PATENT DOCUMENTS

| | | | | |
|---|---|---|---|---|
| DE | 102018215820 | A1 * | 3/2019 | H10W 46/00 |
| DE | 102024200980 | A1 * | 8/2024 | B23K 26/0006 |
| DE | 102019009420 | B4 * | 5/2026 | H10P 72/7408 |
| EP | 2974822 | B1 * | 8/2017 | H10P 54/00 |
| JP | 5151444 | B2 * | 2/2013 | |
| JP | 6391294 | B2 * | 9/2018 | |
| JP | 7463035 | B2 * | 4/2024 | |
| WO | WO-2012096093 | A1 * | 7/2012 | B23K 26/064 |
| WO | WO-2012096094 | A1 * | 7/2012 | B23K 26/0853 |
| WO | WO-2021166696 | A1 * | 8/2021 | H10P 72/7402 |
| WO | WO-2025205514 | A1 * | 10/2025 | H10P 95/00 |

* cited by examiner

PHOTONIC INTEGRATED CIRCUIT CHIP FACET PREPARATION VIA LASER-BASED DICING

TECHNICAL FIELD

The present application claims priority to and the benefit of U.S. Provisional Patent Application No. 63/583,773, entitled "PHOTONIC INTEGRATED CIRCUIT CHIP FACET PREPARATION VIA LASER-BASED DICTING," and filed on Sep. 19, 2023, the contents of which are incorporated herein by reference in their entirety.

TECHNICAL FIELD

Aspects of the present disclosure relate generally to systems and methods for use in the implementation, operation, and/or use of quantum information processing (QIP) systems.

BACKGROUND

Trapped atoms are one of the leading implementations for quantum information processing or quantum computing. Atomic-based qubits may be used as quantum memories, as quantum gates in quantum computers and simulators, and may act as nodes for quantum communication networks. Qubits based on trapped atomic ions enjoy a rare combination of attributes. For example, qubits based on trapped atomic ions have very good coherence properties, may be prepared and measured with nearly 100% efficiency, and are readily entangled with each other by modulating their Coulomb interaction with suitable external control fields such as optical or microwave fields. These attributes make atomic-based qubits attractive for extended quantum operations such as quantum computations or quantum simulations.

It is therefore important to develop new techniques that improve the design, fabrication, implementation, control, and/or functionality of different QIP systems used as quantum computers or quantum simulators, and particularly for those QIP systems that handle operations based on atomic-based qubits.

SUMMARY

The following presents a simplified summary of one or more aspects to provide a basic understanding of such aspects. This summary is not an extensive overview of all contemplated aspects and is intended to neither identify key or critical elements of all aspects nor delineate the scope of any or all aspects. Its sole purpose is to present some concepts of one or more aspects in a simplified form as a prelude to the more detailed description that is presented later.

This disclosure describes various aspects of techniques for the preparation of facets (e.g., edge of chips) of photonic integrated circuits (PICs) via laser-based dicing.

In an aspect of this disclosure, a method for PIC facet preparation is described. The method includes coupling a dicing tape to a bottom side of the wafer. The method also includes performing a first laser processing step to form a modified layer by applying at least one laser beam of a wavelength that has transmissivity through the wafer along a first projected dicing line in a first direction to define a first facet and performing a second laser processing step to form the modified layer applying the at least one laser beam to the wafer along a second projected dicing line in the first direction to define a second facet. The second projected dicing line being parallel to the first projected dicing line. The method further includes expanding the dicing tape in a second direction to divide the wafer from the modified layer along at least the first projected dicing line and the second projected dicing line into PIC chips. The second direction being perpendicular to the first direction.

In an aspect of this disclose, a laser processing apparatus configured to prepare PIC facets is described. The laser processing apparatus includes at least a laser applying unit and a controller. The controller is configured to couple a dicing tape to a bottom side of the wafer. The controller is also configured to cause the laser applying unit to perform a first laser processing step to form a modified layer by generating at least one laser beam of a wavelength that has transmissivity through the wafer along a first projected dicing line in a first direction to define a first facet and cause the laser applying unit to perform a second laser processing step to form the modified layer by generating the at least one laser beam to the wafer along a second projected dicing line in the first direction to define a second facet. The second projected dicing line being parallel to the first projected dicing line. The controller is further configured expand the dicing tape in a second direction to divide the wafer from the modified layer along at least the first projected dicing line and the second projected dicing line into PIC chips. The second direction being perpendicular to the first direction.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

The detailed description set forth below in connection with the appended drawings or figures is intended as a description of various configurations or implementations and is not intended to represent the only configurations or implementations in which the concepts described herein may be practiced. The detailed description includes specific details for the purpose of providing a thorough understanding of various concepts. However, it will be apparent to those skilled in the art that these concepts may be practiced without these specific details or with variations of these specific details. In some instances, well known components are shown in block diagram form, while some blocks may be representative of one or more well-known components.

A photonic integrated circuit (PIC) is a microchip containing two or more photonic components which form a functioning circuit. The photonic components utilize photons (e.g., particles of light) as opposed to electronics. PICs are used to enable a dramatic reduction in size and optical and electronic power consumption of complex optical and optoelectronic systems. Additionally, they enable scalability and manufacturability of same optical and optoelectronic systems. PICs are also used to enable higher stability and better precision of alignment of optical systems.

The present disclosure describes preparing facets for PICs based on silicon photonics and other photonics that operate at wavelengths shorter than infrared. The chips can also include monolithic integration of other electronics or photonic components, including ion traps, III-V semiconductors, or transistor-based integrated circuits (ICs). The application of this disclosure is particularly impactful for shorter-wavelength PICS (e.g., visible and UV light) due to the stricter requirements for location accuracy and precision and facet roughness given the increase of performance sensitivity as the wavelength of light is reduced. In addition, the disclosure may be used for more general widely used material platforms such as Si, SiN, alumina, $SiO_2$, etc.

Figure 3:
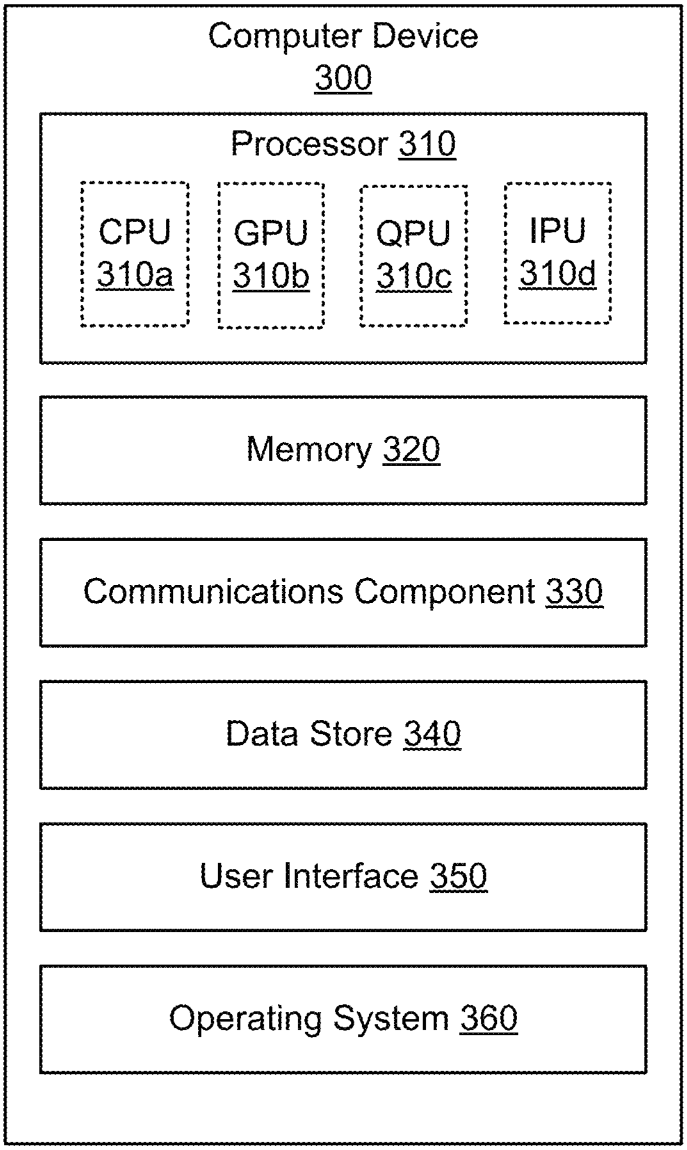
FIG. 3 illustrates an example of a computer device in accordance with aspects of this disclosure.
Figure 4:
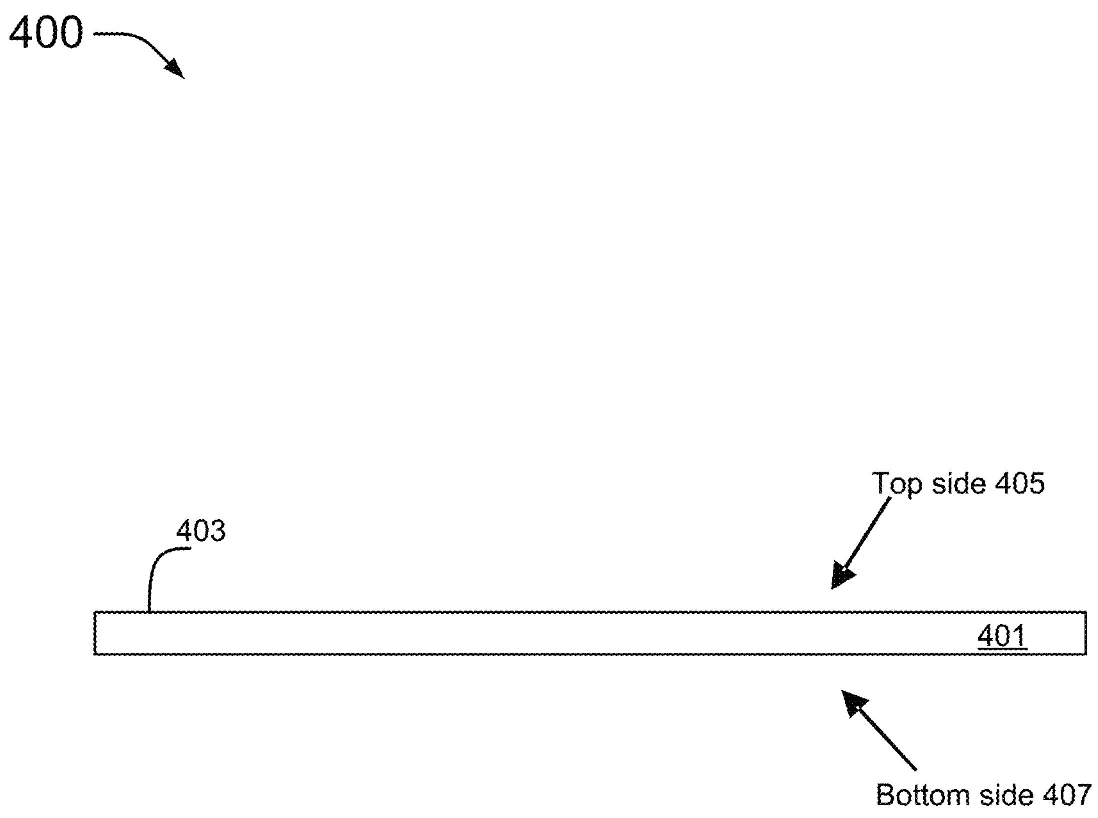
FIG. 4 illustrates a cross-sectional view showing a wafer in accordance with aspects of this disclosure.
Figure 5A:
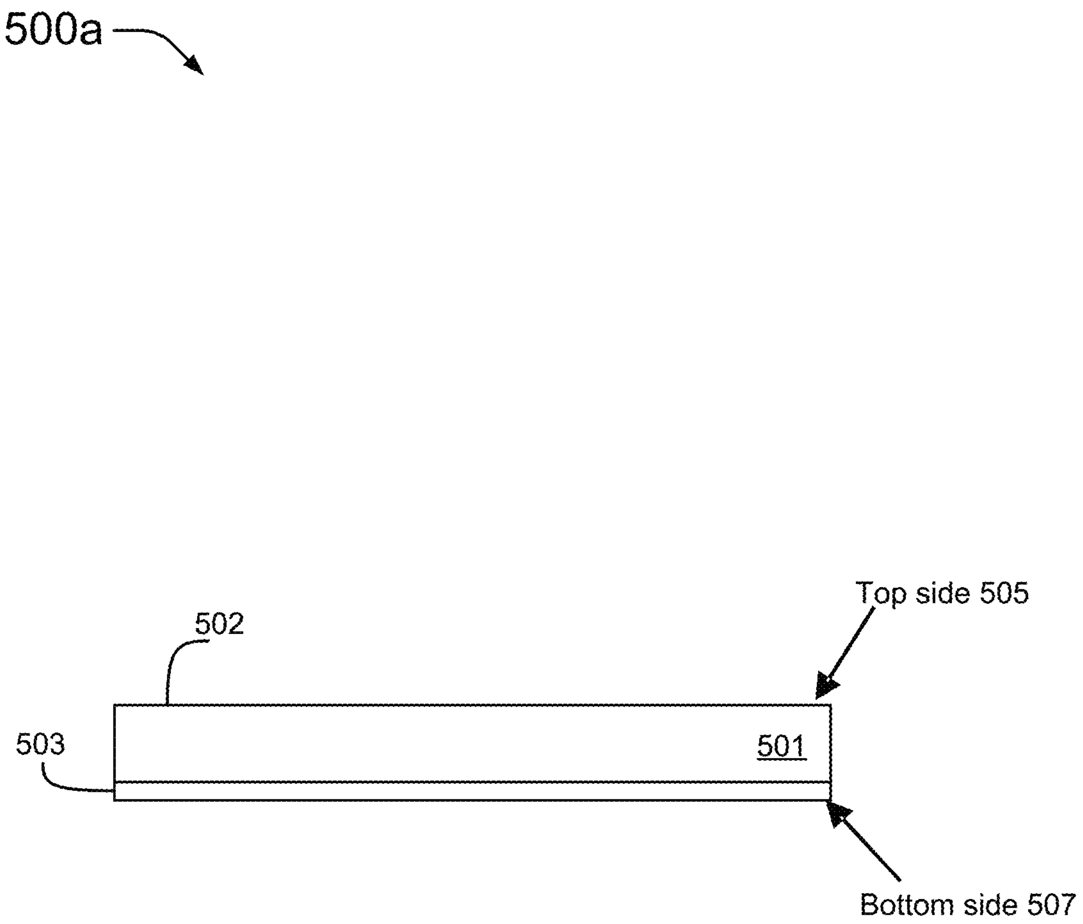
FIGS. 5A-5D illustrate a cross-sectional view showing a process of preparing photonic integrated circuits (PICs) using laser stealth dicing in accordance with aspects of this disclosure.
Figure 5B:
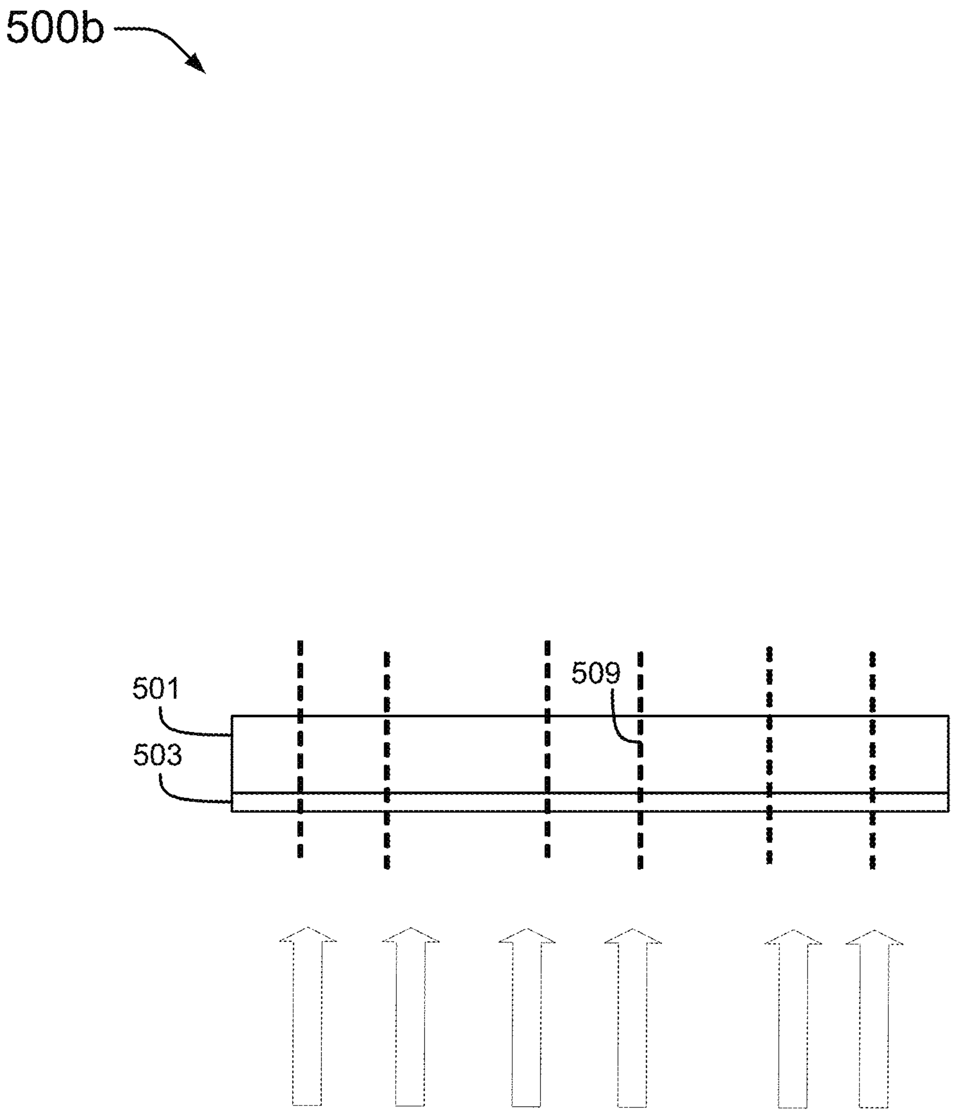
Figure 5C:
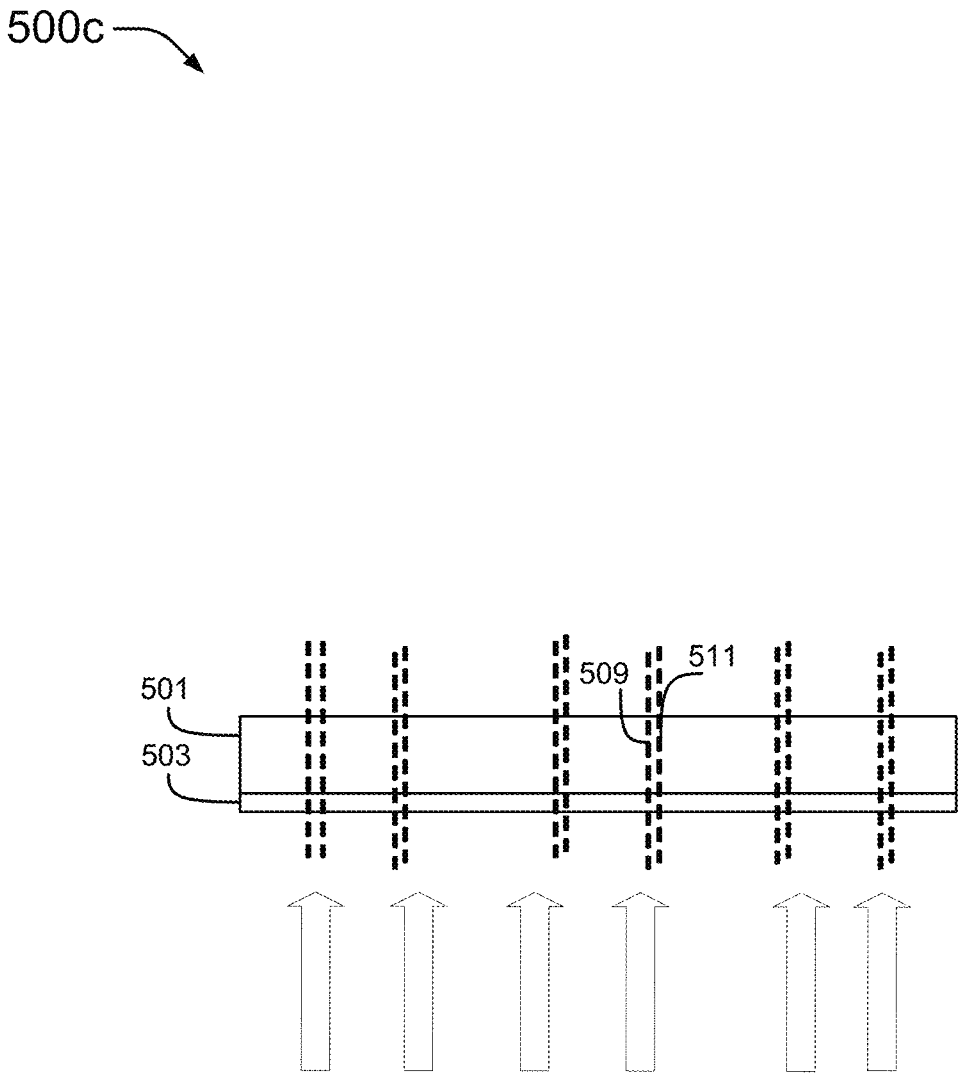
Figure 5D:
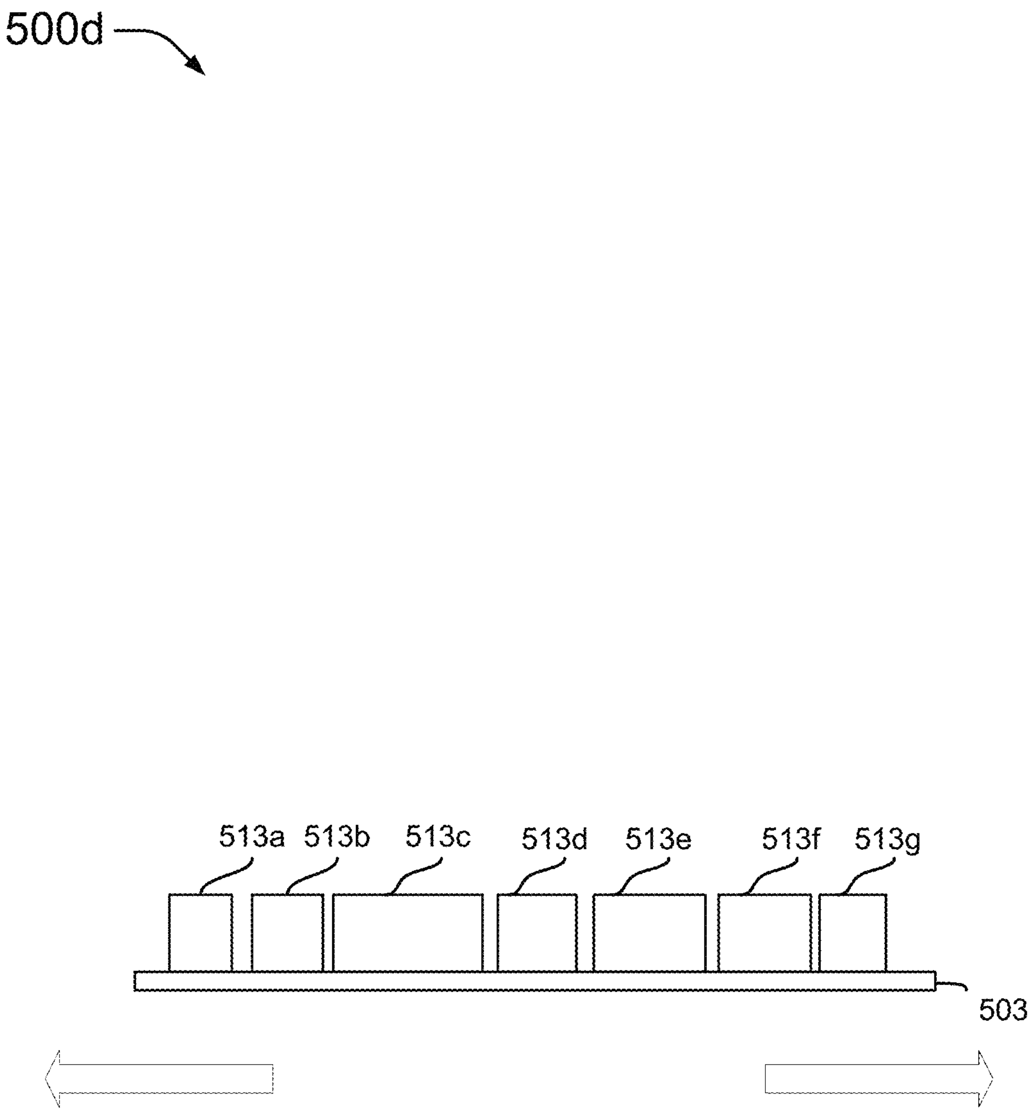
Figure 6:
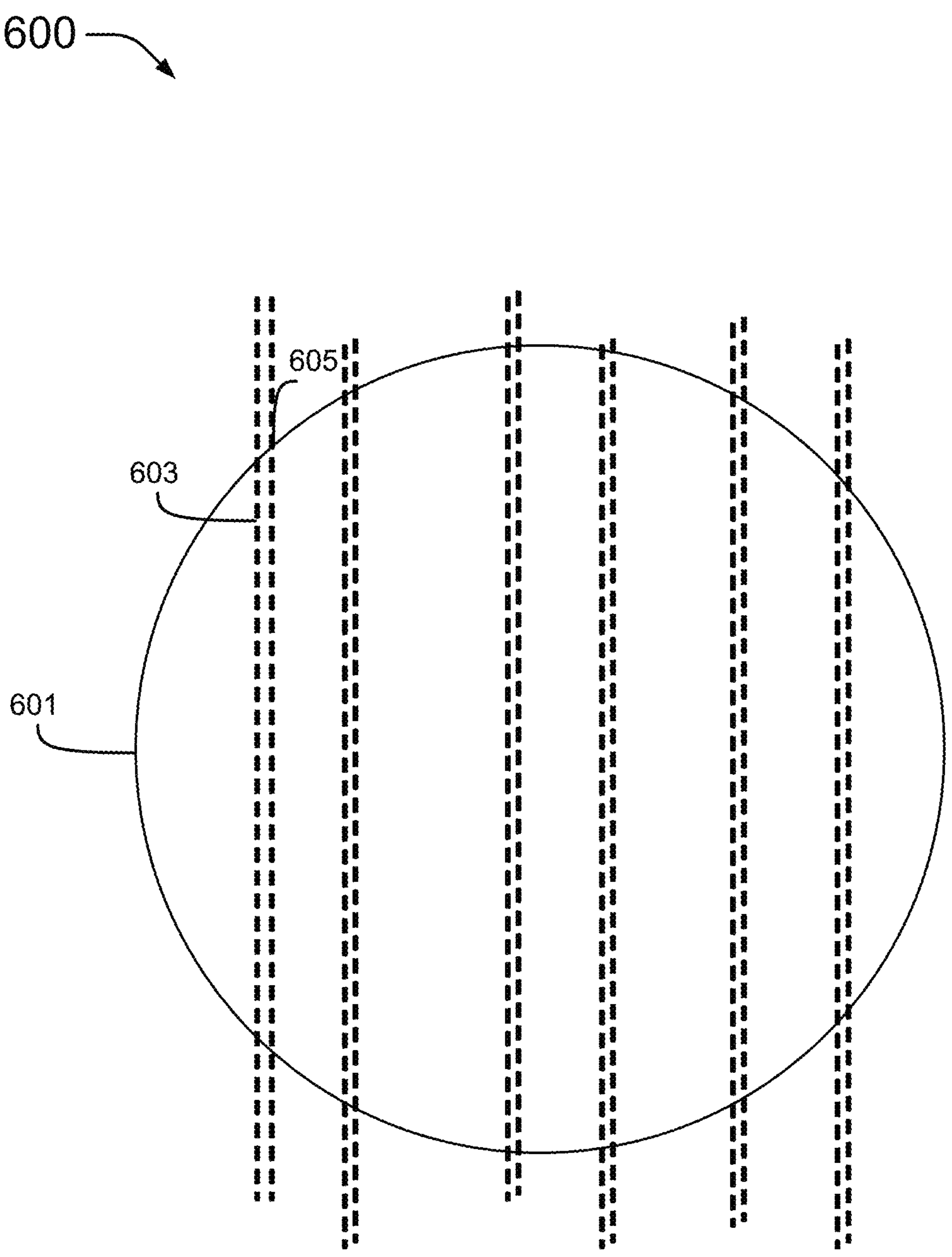
FIG. 6 illustrates a top view example showing the outcome of a step of defining facets on a wafer using "double-pass" dicing lines made by laser stealth dicing in accordance with aspects of this disclosure.
Figure 7:
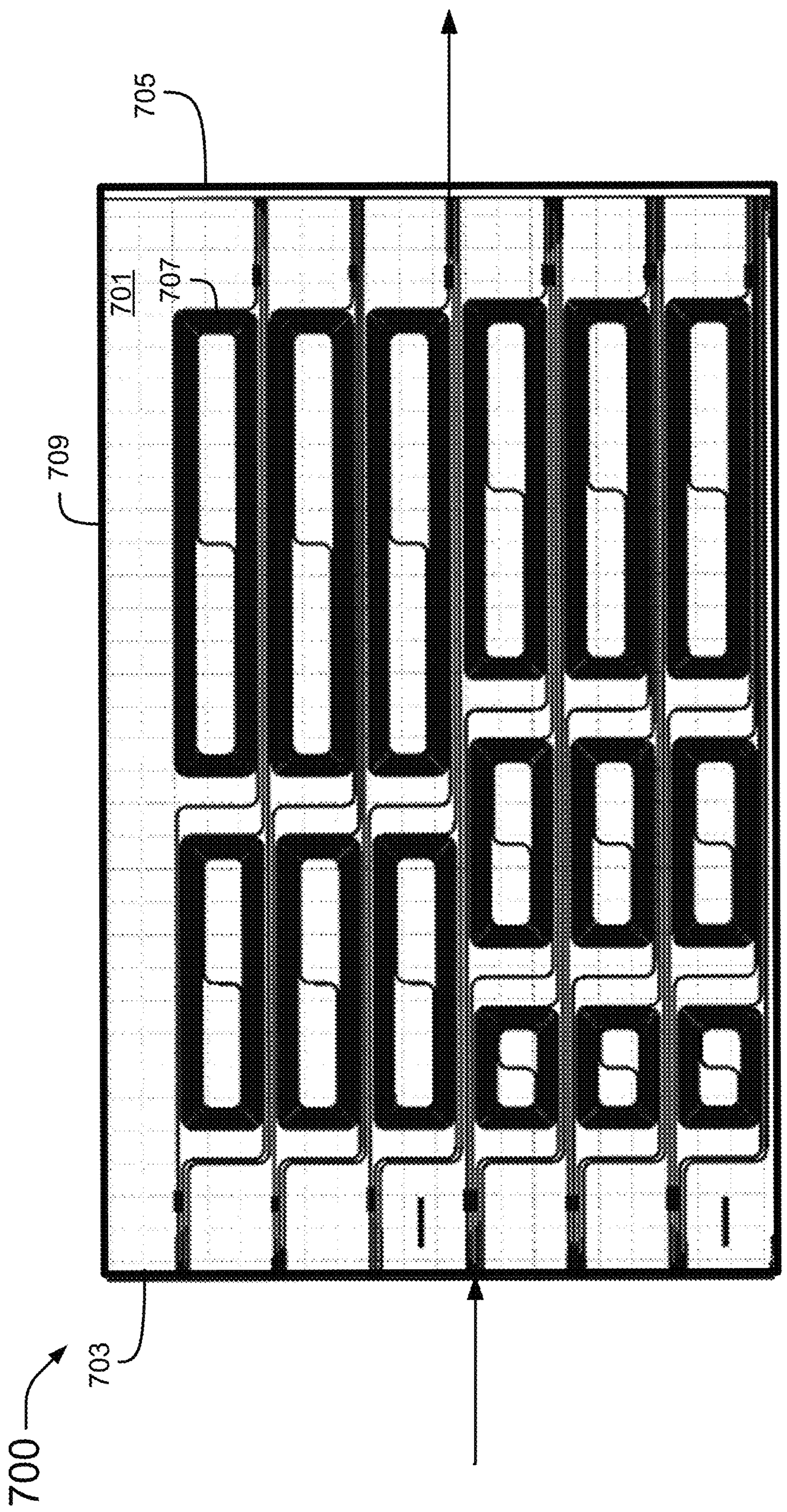
FIG. 7 illustrates an example of a plan view of a PIC chip with facets in accordance with aspects of this disclosure.

Solutions to the issues described above are explained in more detail in connection with FIGS. 1-11, with FIGS. 1-3 providing a background of quantum information processing (QIP) systems or quantum computers, and more specifically, of atomic-based QIP systems or quantum computers, FIG. 4 provides a brief description of a wafer, FIGS. 5A-5D and 8 provide a description of preparing facets for PICs based on silicon photonics, FIG. 6 provides a top view of preparing facets for PICs, and FIG. 7 provides an example of a result of preparing the facets for PICS, in accordance with various example aspects of the present disclosure.

Figure 1:
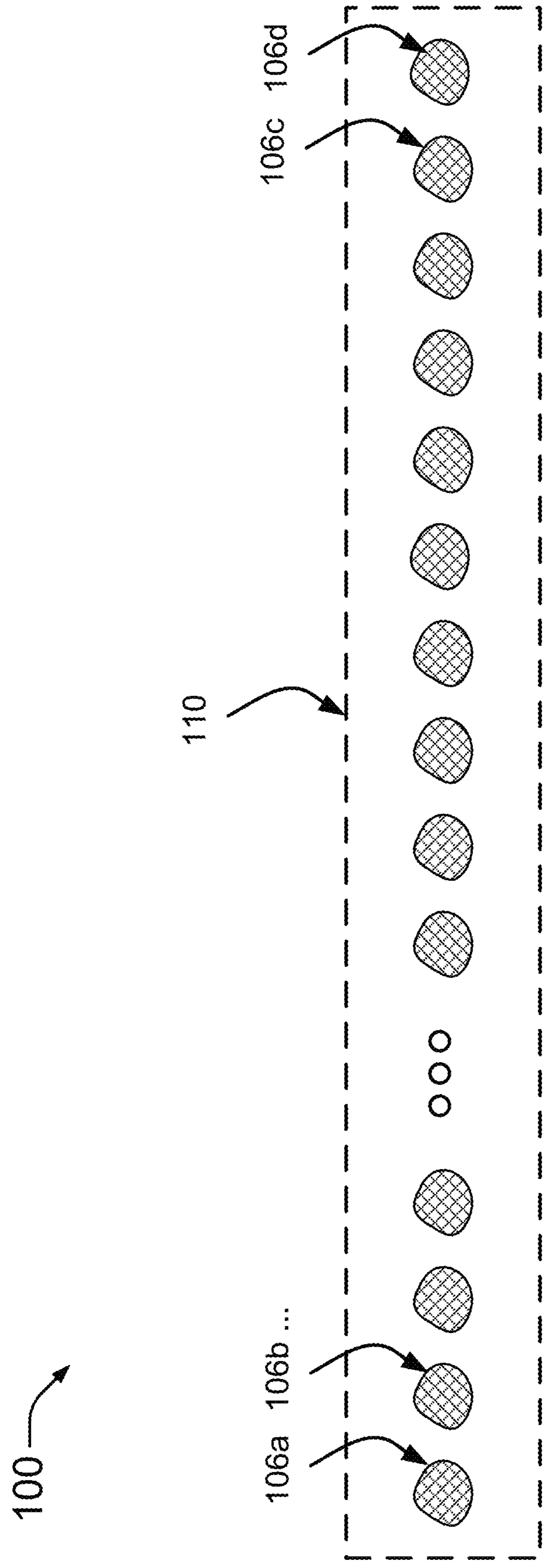
FIG. 1 illustrates a view of atomic ions a linear crystal or chain in accordance with aspects of this disclosure.
Figure 2:
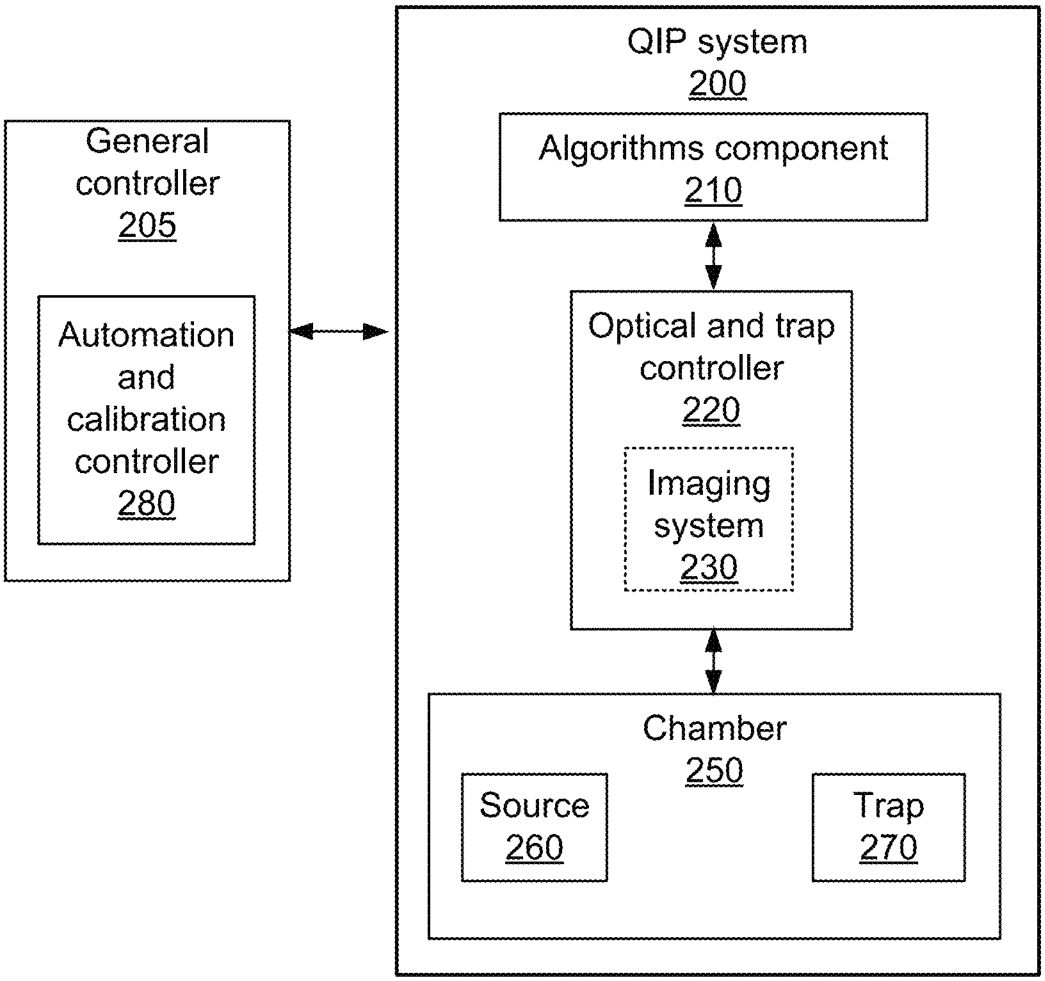
FIG. 2 illustrates an example of a quantum information processing (QIP) system in accordance with aspects of this disclosure.

FIG. 1 illustrates a diagram 100 with multiple atomic ions or ions 106 (e.g., ions 106*a*, 106*b*, . . . , 106*c*, and 106*d*) trapped in a linear crystal or chain 110 using a trap (not shown; the trap can be inside a vacuum chamber as shown in FIG. 2). The trap maybe referred to as an ion trap. The ion trap shown may be built or fabricated on a semiconductor substrate, a dielectric substrate, or a glass die or wafer (also referred to as a glass substrate). The ions 106 may be provided to the trap as atomic species for ionization and confinement into the chain 110. Some or all of the ions 106 may be configured to operate as qubits in a QIP system.

In the example shown in FIG. 1, the trap includes electrodes for trapping or confining multiple ions into the chain 110 laser-cooled to be nearly at rest. The number of ions trapped can be configurable and more or fewer ions may be trapped. The ions can be ytterbium ions (e.g., $^{171}Yb^+$ ions), for example. The ions are illuminated with laser (optical) radiation tuned to a resonance in $^{171}Yb^+$ and the fluorescence of the ions is imaged onto a camera or some other type of detection device (e.g., photomultiplier tube or PMT). In this example, ions may be separated by a few microns (μm) from each other, although the separation may vary based on architectural configuration. The separation of the ions is determined by a balance between the external confinement force and Coulomb repulsion and does not need to be uniform. Moreover, in addition to ytterbium ions, barium ions, neutral atoms, Rydberg atoms, or other types of atomic-based qubit technologies may also be used. Moreover, ions of the same species, ions of different species, and/or different isotopes of ions may be used. The trap may be a linear RF Paul trap, but other types of confinement devices may also be used, including optical confinements. Thus, a confinement device may be based on different techniques and may hold ions, neutral atoms, or Rydberg atoms, for example, with an ion trap being one example of such a confinement device. The ion trap may be a surface trap, for example.

The chain 110 of ions 106 may be part of a QPU, that is, the chain 110 of ions 106 may be part of a processing engine or processing core of a QIP system. When any one of the ions 106 is capable of being connected to any other ion 106 in the chain 110, the chain 110 is considered to be fully connected, and thus, it can be used to implement a fully connected QPU. Fully connected QPUs need not be limited to atomic-based QIP systems.

FIG. 2 illustrates a block diagram that shows an example of a QIP system 200. The QIP system 200 may also be referred to as a quantum computing system, a quantum computer, a computer device, a trapped ion system, or the like. The QIP system 200 may be part of a hybrid computing system in which the QIP system 200 is used to perform quantum computations and operations and the hybrid computing system also includes a classical computer to perform classical computations and operations. The quantum and classical computations and operations may interact in such a hybrid system.

Shown in FIG. 2 is a general controller 205 configured to perform various control operations of the QIP system 200. These control operations may be performed by an operator, may be automated, or a combination of both. Instructions for at least some of the control operations may be stored in memory (not shown) in the general controller 205 and may be updated over time through a communications interface (not shown). Although the general controller 205 is shown separate from the QIP system 200, the general controller 205 may be integrated with or be part of the QIP system 200. The general controller 205 may include an automation and calibration controller 280 configured to perform various calibration, testing, and automation operations associated with the QIP system 200. These calibration, testing, and automation operations may involve, for example, all or part of an algorithms component 210, all or part of an optical and trap controller 220 and/or all or part of a chamber 250.

The QIP system 200 may include the algorithms component 210 mentioned above, which may operate with other parts of the QIP system 200 to perform or implement quantum algorithms, quantum applications, or quantum operations. The algorithms component 210 may be used to perform or implement a stack or sequence of combinations of single qubit operations and/or multi-qubit operations (e.g., two-qubit operations) as well as extended quantum computations. The algorithms component 210 may also include software tools (e.g., compilers) that facility such performance or implementation. As such, the algorithms component 210 may provide, directly or indirectly, instructions to various components of the QIP system 200 (e.g., to the optical and trap controller 220) to enable the performance or implementation of the quantum algorithms, quantum applications, or quantum operations. The algorithms component 210 may receive information resulting from the performance or implementation of the quantum algorithms, quantum applications, or quantum operations and may process the information and/or transfer the information to another component of the QIP system 200 or to another device (e.g., an external device connected to the QIP system 200) for further processing.

The QIP system 200 may include the optical and trap controller 220 mentioned above, which controls various aspects of a trap 270 in the chamber 250, including the generation of signals to control the trap 270. The optical and trap controller 220 may also control the operation of lasers, optical systems, and optical components that are used to provide the optical beams that interact with the atoms or ions in the trap. Optical systems that include multiple components may be referred to as optical assemblies. The optical beams are used to set up the ions, to perform or implement quantum algorithms, quantum applications, or quantum operations with the ions, and to read results from the ions. Control of the operations of laser, optical systems, and optical components may include dynamically changing operational parameters and/or configurations, including controlling positioning using motorized mounts or holders. When used to confine or trap ions, the trap 270 may be referred to as an ion trap. The trap 270, however, may also be used to trap neutral atoms, Rydberg atoms, and other types of atomic-based qubits. The lasers, optical systems, and optical components can be at least partially located in the optical and trap controller 220, an imaging system 230, and/or in the chamber 250.

The QIP system 200 may include the imaging system 230. The imaging system 230 may include a high-resolution imager (e.g., CCD camera) or other type of detection device (e.g., PMT) for monitoring the ions while they are being provided to the trap 270 and/or after they have been provided to the trap 270 (e.g., to read results). In an aspect, the imaging system 230 can be implemented separate from the optical and trap controller 220, however, the use of fluorescence to detect, identify, and label ions using image processing algorithms may need to be coordinated with the optical and trap controller 220.

In addition to the components described above, the QIP system 200 can include a source 260 that provides atomic species (e.g., a plume or flux of neutral atoms) to the chamber 250 having the trap 270. When atomic ions are the basis of the quantum operations, that trap 270 confines the atomic species once ionized (e.g., photoionized). The trap 270 may be part of what may be referred to as a processor or processing portion of the QIP system 200. That is, the trap 270 may be considered at the core of the processing operations of the QIP system 200 since it holds the atomic-based qubits that are used to perform or implement the quantum operations or simulations. At least a portion of the source 260 may be implemented separate from the chamber 250.

It is to be understood that the various components of the QIP system 200 described in FIG. 2 are described at a high-level for ease of understanding. Such components may include one or more sub-components, the details of which may be provided below as needed to better understand certain aspects of this disclosure.

Aspects of this disclosure may be implemented at least partially using one or more of the general controller 205, the automation and calibration controller 280, the optical and trap controller 220, and the chamber 250.

Referring now to FIG. 3, an example of a computer system or device 300 is shown. The computer device 300 may represent a single computing device, multiple computing devices, or a distributed computing system, for example. The computer device 300 may be configured as a quantum computer (e.g., a QIP system), a classical computer, or to perform a combination of quantum and classical computing functions, sometimes referred to as hybrid functions or operations. For example, the computer device 300 may be used to process information using quantum algorithms, classical computer data processing operations, or a combination of both. In some instances, results from one set of operations (e.g., quantum algorithms) are shared with another set of operations (e.g., classical computer data processing). A generic example of the computer device 300 implemented as a QIP system capable of performing quantum computations and simulations is, for example, the QIP system 200 shown in FIG. 2.

The computer device 300 may include a processor 310 for carrying out processing functions associated with one or more of the features described herein. The processor 310 may include a single processor, multiple set of processors, or one or more multi-core processors. Moreover, the processor 310 may be implemented as an integrated processing system and/or a distributed processing system. The processor 310 may include one or more central processing units (CPUs) 310*a*, one or more graphics processing units (GPUs) 310*b*, one or more quantum processing units (QPUs) 310*c*, one or more intelligence processing units (IPUs) 310*d* (e.g., artificial intelligence or AI processors), or a combination of some or all those types of processors. In one aspect, the processor 310 may refer to a general processor of the computer device 300, which may also include additional processors 310 to perform more specific functions (e.g., including functions to control the operation of the computer device 300). Quantum operations may be performed by the QPUs 310*c*. Some or all of the QPUs 310*c* may use atomic-based qubits, however, it is possible that different QPUs are based on different qubit technologies. One or more of the QPUs 310*c* may be fully connected QPUs in accordance with aspects of this disclosure.

The computer device 300 may include a memory 320 for storing instructions executable by the processor 310 to carry out operations. The memory 320 may also store data for processing by the processor 310 and/or data resulting from processing by the processor 310. In an implementation, for example, the memory 320 may correspond to a computer-readable storage medium that stores code or instructions to perform one or more functions or operations. Just like the processor 310, the memory 320 may refer to a general memory of the computer device 300, which may also include additional memories 320 to store instructions and/or data for more specific functions.

It is to be understood that the processor 310 and the memory 320 may be used in connection with different operations including but not limited to computations, calculations, simulations, controls, calibrations, system management, and other operations of the computer device 300, including any methods or processes described herein.

Further, the computer device 300 may include a communications component 330 that provides for establishing and maintaining communications with one or more parties utilizing hardware, software, and services. The communications component 330 may also be used to carry communications between components on the computer device 300, as well as between the computer device 300 and external devices, such as devices located across a communications network and/or devices serially or locally connected to computer device 300. For example, the communications component 330 may include one or more buses, and may further include transmit chain components and receive chain components associated with a transmitter and receiver, respectively, operable for interfacing with external devices. The communications component 330 may be used to receive updated information for the operation or functionality of the computer device 300.

Additionally, the computer device 300 may include a data store 340, which can be any suitable combination of hardware and/or software, which provides for mass storage of information, databases, and programs employed in connection with the operation of the computer device 300 and/or any methods or processes described herein. For example, the data store 340 may be a data repository for operating system 360 (e.g., classical OS, or quantum OS, or both). In one implementation, the data store 340 may include the memory 320. In an implementation, the processor 310 may execute the operating system 360 and/or applications or programs, and the memory 320 or the data store 340 may store them.

The computer device 300 may also include a user interface component 350 configured to receive inputs from a user of the computer device 300 and further configured to generate outputs for presentation to the user or to provide to a different system (directly or indirectly). The user interface component 350 may include one or more input devices, including but not limited to a keyboard, a number pad, a mouse, a touch-sensitive display, a digitizer, a navigation key, a function key, a microphone, a voice recognition component, any other mechanism capable of receiving an input from a user, or any combination thereof. Further, the user interface component 350 may include one or more output devices, including but not limited to a display, a speaker, a haptic feedback mechanism, a printer, any other mechanism capable of presenting an output to a user, or any combination thereof. In an implementation, the user interface component 350 may transmit and/or receive messages corresponding to the operation of the operating system 360. When the computer device 300 is implemented as part of a cloud-based infrastructure solution, the user interface component 350 may be used to allow a user of the cloud-based infrastructure solution to remotely interact with the computer device 300.

In connection with the systems described in FIGS. 1-3, a technique or method for preparation of facets for PICs based on photons is described. The technique is primarily used to define accurate and precise facets of the PICs to achieve low-loss coupling from and into a desired free-space mode, fiber, or another PIC chip. In addition, the facets formed from these techniques have low facet surface roughness and high flatness.

Applications using PICs often require the ability to couple light on and off of a chip from one or more chip edges. Accordingly, to achieve a low-loss coupling from and into a desired free-space, fiber, or another PIC chip, the facets of the PIC chips must be defined in accurate and precise locations. In addition, the facets must have low facet surface roughness and high flatness.

There are several common ways to prepare these facets.

A first process includes mechanical cleaving, which is typically a manual process that is limited in its position precision and accuracy. Mechanical cleaving has limited ability to make extremely straight chip edges. Furthermore, mechanical cleaving is not well-suited to scalable, wafer-level processing.

A second process includes polishing, which is also another mechanical process that typically is performed after saw-based chip dicing. Similar to the mechanical cleaving process, polishing is time-consuming, has limited precision and accuracy in terms of positioning, and is not amendable to wafer-level processing.

A third process includes saw-based dicing, which typically produces facets with high surface roughness. This leads to undesirably poor and variable coupling, especially at short wavelengths such as visible or UV, where scattering is exacerbated.

A fourth process includes etching, which produces highly accurate and precise locations. However, it is difficult to control a facet sidewall angle. In addition, etching through the whole substrate below the PIC is challenging. Etching is also not widely available and is often precluded by the need to maintain wafer mechanic integrity during processing. Partial etching through the substrate also leaves behind a substrate "shelf" which can interfere with fiber-to-chip packaging and other heterogeneous integration approaches. Furthermore, etching results in unacceptable chip facet surface roughness.

Stealth dicing is another process of dividing a wafer. According to stealth dicing, a transmissive laser beam is focused within a wafer, thereby forming a modified layer (modified region) modified by multiphoton absorption. The wafer can then be divided starting from the modified layers along the projected division lines.

The disclosure describes a technique of preparing facets for PICs based on silicon photonics and other photonics that operate at wavelengths shorter than infrared. The facet preparation technique may use laser-based stealth dicing to define facets by producing "double-pass" dicing lines. Laser-based stealth dicing has been primarily used for dicing wafers without resulting in surface damage or dicing debris/process waste. However, due to the particular details of the stealth dicing process, stealth dicing has the additional benefits of enabling wafer-scale PIC chip facet preparation, enabling high accuracy, high precision location of facets, enabling accurate and precise facet sidewall angle, enabling low surface roughness and high surface flatness. Accordingly, stealth dicing may be used to generate facets for PICs since these PICs are used in applications (i.e., quantum computing, bio-sensing) where the chip top surfaces must be clean.

In some examples, a PIC is a monolithic device including at least an optical waveguide and another photonic device co-fabricated, arranged, or interconnected on a same substrate. The optical device is optically coupled to the waveguide, with a portion of either the waveguide or optical device physically free of substrate to an extent permitting a physical displacement relative to the substrate sufficient to modulate an interaction between the photonic device and a mode propagated in the waveguide.

Laser dicing may be performed by ablation laser cutting and/or by stealth dicing. Stealth dicing is a processing method that forms a modified layer (e.g., decomposed crystalline) in a workpiece by focusing a laser inside the workpiece before separating the die using a tape expander. Since stealth dicing modifies the internal part of the workpiece, it is possible to leave no scratches on the surface of the workpiece and also generate little to no processing waste. In addition, stealth dicing is a completely dry process that requires no water, which makes it suitable for workpieces that are vulnerable to loading such as micro-electromechanical systems (MEMS). In addition, stealth dicing can make a thin kerf, which contributes to street (e.g., channel between the chips) reduction.

Generally, a wafer may be subjected to a stealth dicing process to divide pieces of the wafer along at least one division line where the modified regions are formed by expanding a dicing tape, thereby obtaining individual dies. The advantage of using stealth dicing is that stealth dicing minimizes the generation of particles as opposed to using a saw-based dicing that generates a significant number of particles that may affect the performance of the resulting PICs. In addition, stealth dicing is a non-violent way to separate components. Accordingly, stealth dicing produces very flat and smooth facets for edge coupling of PICs.

Typically, other laser dicing techniques involve having two chips that are next to each other on a wafer such that when a single cut on the wafer produces two facets at once. However, with stealth dicing techniques, chips must be spaced out farther because there needs to be more space between the chips for a laser to go through. Accordingly, chips will be spaced out farther on a wafer such that the stealth dicing makes two laser passes through a crossing division line (e.g., street). Another advantage of using two laser passes with stealth dicing is the ability to independently define a location of facets on each chip. Thus, using a double laser pass enables more precise facets needed for PICs.

For PICs, such as those used in applications where chip top surfaces still must be clean (e.g., quantum computing, or bio-sensing), the present disclosure takes advantage of the benefits of stealth dicing to produce chips or dies. The application of this invention is particularly important for shorter-wavelength PICs (e.g., visible and UV light) due to stricter requirements for location accuracy, precision, and facet roughness given the increase of performance sensitivity as the wavelength of light is reduced.

The disclosure describes techniques primarily used for dicing wafers without generation of surface damage or dicing debris and/or process waste. However, due to the particular details of the stealth dicing process, the disclosure also describes additional benefits of enabling wafer-scale PIC chip facet preparation, enabling high accuracy, and high precision location of facets. For example the present disclosure enables accurate and precise facet sidewall angles. By this way, the facets are produced with low surface roughness and high surface flatness. In addition, the present disclosure completely eliminates a substrate "-shelf" to enable fiber-array to chip packaging and other heterogeneous integration approaches.

FIG. 4 illustrates a cross-sectional view showing a wafer in accordance with aspects of this disclosure. A wafer may have any type of shape. For example, the wafer 401 may have a circular shape, an oval shape, an elliptical shape, or a polygonal shape. The wafer 401 may be made of a semiconductor (e.g., silicon (Si)). These silicon wafers may include devices such as integrated circuits (ICs) and large scale integration (LSI) on a silicon substrate. In some examples, the wafer may be an optical device wafer configured by forming optical devices, such as light emitting diodes (LEDs) on an inorganic material substrate such as glass, ceramic, or sapphire. The wafer 401 is not limited to this and can be formed in any other way.

In some examples, the wafer 401 may be a MEMS wafer having MEMS devices formed on the surface of a top side 405 (e.g., a first side). Devices may be formed in a device area 403 on the top side 405 of the wafer 401. In examples, where the wafer has a circular shape, the device area 403 may also have a circular shape and be arranged concentrically with the outer circumference of the wafer 401.

As shown in example 400 of FIG. 4, the wafer 401 has a top side 405 where devices are formed and a bottom side 407 (e.g., a second side) opposite to the top side 405. The bottom side 407 may have a plurality of protrusions protruding along a thickness direction of the wafer 401. The protrusions may be surface unevenness or roughness, bumps, optical elements, other structures, or the like.

FIGS. 5A-5D illustrate a cross-sectional view showing a process of preparing photonic integrated circuits (PICs) using laser stealth dicing in accordance with aspects of this present disclosure. Specifically, FIGS. 5A-5D describe a process for preparing facets for PICs based on silicon photonics and any other photonics that operate at wavelengths shorter than infrared.

FIG. 5A illustrates a cross-sectional view showing an outcome of attaching a dicing tape to a wafer. As shown in example 500*a*, a wafer 501 may have a top side 505 and a bottom side 507. The top side 505 may be the side on which the device area 502 is formed. The top side (or front side) of the wafer may be substantially flat or an even surface. The bottom side 507 may also be known as a non-device side.

A dicing tape 503 may be applied to a bottom side of the wafer 601. In some examples, the dicing tape may be any expandable adhesive tape such as an expansion tape.

FIG. 5B illustrates a cross-sectional view showing an outcome of applying a first laser processing step performed on the wafer shown in FIG. 5A. As shown in the example in 500*b*, the wafer 501 may be processed (e.g., cut) along a set of division lines, from the bottom side (or back side), as indicated by arrows and dashed lines. In some examples, the wafer is cut by a stealth dicing process that forms a modified layer inside the wafer by applying a laser beam along a first projected dicing line 509 in a first direction to define a first facet.

In some examples, the stealth dicing process may be applied from a top side of the wafer.

FIG. 5C illustrates a cross-sectional view showing an outcome of applying a second laser processing step performed on the wafer shown in FIG. 5B. Similar to the process described in example 500*b* in FIG. 5B, as shown in the example 500*c*, the wafer is processed along another set of division lines, from the bottom side, as indicated by arrows and dashed lines. In some examples, the wafer is cut by a stealth dicing process that forms the modified layer inside the wafer by applying the laser beam along a second projected dicing line that is parallel to the first projected dicing line 511 to define a second facet. It is noted that the term "parallel" can be considered to be "substantially parallel" in that the two dicing lines may not be exactly parallel and there may be slightly off parallel by one to two degrees, for example, to take in account minor manufacturing variances.

Performing stealth dicing from a bottom side of the wafer is advantageous if elements such as metal structures are provided on the top side of the wafer, which affect or may block transmission of a pulsed laser beam.

FIG. 5D illustrates a cross-sectional view showing an outcome of expanding the dicing tape performed on the wafer shown in FIG. 5C. Subsequently, as shown in the example 500*d* in FIG. 5D, the wafer 501 may be divided (e.g., broken) along the division lines where the modified regions are formed by expanding the dicing tape 503 in a direction as indicated by the two arrows. Specifically, the dicing tape 503 may be radially expanded (e.g., by using an expansion drum or the like, as indicated by the two arrows) away from each other, thereby increasing the distances between adjacent chips or dies. Subsequently, the diced chips or dies 513*a*, 513*b*, 513*c*, 513*d*, 513*e*, 513*f*, 513*g* are separated with each chip having smooth and precise PIC facets.

FIG. 6 illustrates a top view example 600 of a wafer with "double-pass" dicing lines produced by laser stealth dicing to define facets. These figures are merely intended to show how the facet preparation approach described herein applies to a wafer from different views. As mentioned above, the facets of the PIC chips must be accurately defined and in very precise locations with low facet surfaces roughness and high flatness.

A top view of the wafer 601 is represented in example 600 in FIG. 6. The laser-based stealth dicing method may perform a "double-pass" dicing line to generate a first dicing line 603 and a second dicing line 605. The two dicing lines 603, 605 are very close together to precisely locate the facet for a right side of a first chip and a left side of a second chip (e.g., that is located adjacent to the first chip). Thus, the facet of the chips are not limited by the actual size of the laser. In addition, the resulting structure have improved facets as compared to structures created by a single pass of a laser.

In addition, the laser may also scan down in a horizontal direction to eventually make rectangles and squares.

A side view of the wafer is represented in example 500*a* in FIG. 5A. Specifically, example 500*b* shows a first dicing line 509 and example 500*c* shows a second dicing line 509 from a side view of the wafer 501.

In some examples, the dicing may come from a bottom side. In examples where dicing may come from the bottom side, the wafer must be polished on backside. Performing stealth dicing from a bottom side of a wafer may also be beneficial if elements, such as metal structures, are provided on the top side of the wafer, which may affect or block transmission of the pulsed laser beam.

In other examples, the dicing may come from a top side. When dicing comes in from the top side, there should be approximately 300 microns of clearance for the dicing laser beams. If dicing comes in from the bottom side, the chips may be placed on an order of magnitude closer to one another.

FIG. 7 shows a diagram that illustrates an example of a plan view of a PIC 701 chip with facets. A PIC may be any semiconductor device, including silicon device, which has at least two elements integrated in an optical circuit. The PIC 701 may be formed of any material suitable for photonic devices and photonic operation, such as silicon-based materials, non-silicon material, or a combination of silicon and non-silicon material. The PIC may include one or more optical devices controlled and/or driven, at least in part, by control and/or driver circuitry included in the electronic components. The electronic components may include one or more application specific integrated circuits (ASICs), and may be formed of any material suitable for electronic devices and electronic operation, such as Si.

Specifically, example 700 of FIG. 7 shows a PIC 701 with a substrate 709 and groups of integrated and optically coupled active and passive components formed in a series of signal channels or optical paths on a substrate. Each optical path may include a laser or optical source.

In addition, the PIC 701 shows two facets 703, 705. The facets may face in a perpendicular direction to where light is coming in. In some examples, the facet may not necessarily be at a 90-degree angle relative to a horizontal plane of the substrate 709. A facet may be angled in the horizontal plane relative to optical beam entering or exiting the substrate 709.

In this example, light couples into a first facet 703 on the PIC 701 chip and travels through waveguides 707 to eventually couple out of a second facet 705 on the PIC 701 chip.

Those in the art will recognize that although the present disclosure only describes two facets, there may be any number of facets on the PIC chip.

Figure 8:
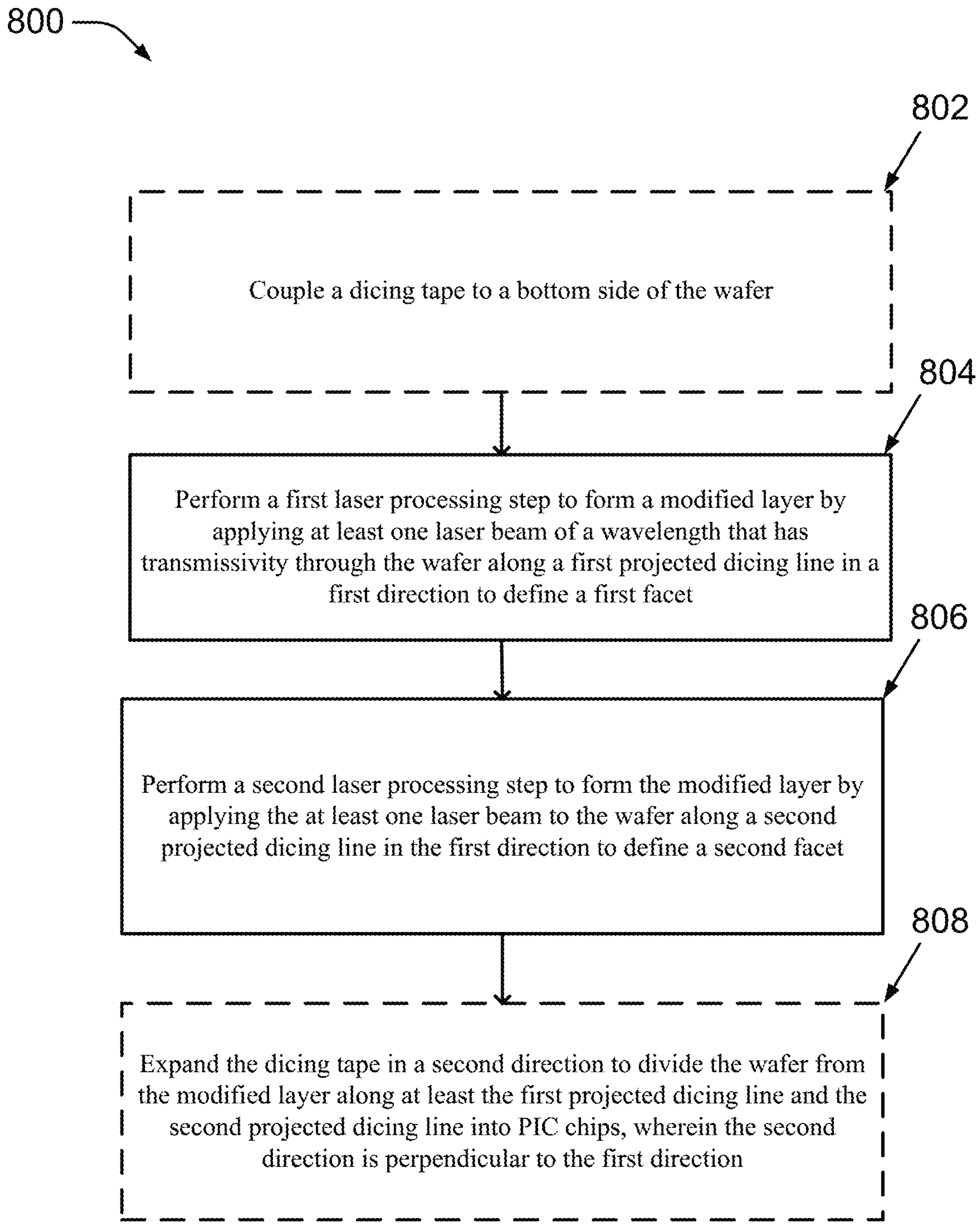
FIG. 8 illustrates a flow chart describing a method for optimized calibration for fully connected QPUs in accordance with aspects of this disclosure.

FIG. 8 illustrates a flow chart describing a method 800 for preparing facets in a PIC. The method may be implemented, at least in part, by using a laser processing apparatus including at least a laser applying unit. In some examples, the laser applying unit may include at least laser and a focusing lens. In some examples, the laser processing apparatus may further include a chuck table to hold a wafer. Some aspects may be implemented using other tools, systems, or devices, as is discussed herein. Optional aspects are illustrated in dashed lines.

Optionally, at 802, the method 800 may include coupling a dicing tape to a first side of a wafer. In some examples, the first side of the water may correspond to a bottom side of the wafer. As an example, referring back to FIG. 5A, a dicing tape 503 is applied to a bottom side of the wafter 501.

At 804, the method 800 may include performing a first laser processing step to form a modified layer by applying at least one laser beam of a wavelength that has transmissivity through the wafer along a first projected dicing line in a first direction to define a first facet. In some examples, the at least one laser beam may be focused at a predetermined depth inside the wafer. The inside of the wafer may then be modified.

As an example, referring back to FIG. 6, the laser beam is applied along a first projected dicing line 603 in a first direction to define a first facet on a wafer 601. As another example, referring back to FIG. 5B, a laser beam is applied along a first projected dicing line 509 in a first direction to define a first facet for a first chip or die.

At 806, the method 800 may include performing a second laser processing step to form the modified layer by applying the at least one laser beam to the wafer along a second projected dicing line in the first direction to define a second facet. In some examples, the second projected dicing line is parallel to the first projected dicing line. It is also noted that while laser processing steps at 804 and 806 are described as being performed in sequence, these steps can be performed in parallel in another exemplary aspect. The benefit of having a double laser pass instead of a single laser pass is that using a double laser pass allows the laser processing apparatus to independently define locations for the facets on each chip. This in turn results in PICs with improved facets as compared to facet preparation with a single laser pass.

As an example, referring back to FIG. 6, the laser beam is applied along a second projected dicing line 605 in the first direction to define a second facet on the wafer 601. As another example, referring back to FIG. 5C, the laser beam is applied along a second projected dicing line 511 in the first direction to define a second facet for a second chip or die. In an aspect of the method 800, the second projected dicing line is approximately 300 microns from the first projected dicing line. It should be appreciated that according to this configuration, the first projected dicing line 509 provides a side (e.g., a boundary) of one PIC and the second projected dicing line 511 provides a side (e.g., a boundary) of a second PIC facing the first PIC that is adjacent thereto. As an example referring to FIG. 5D, taking diced chip 513*d* as an example, the first projected dicing line 509 creates a right side boundary for the diced chip 513*d* and the second projected dicing line 511 creates a left side boundary for the diced chip 513*d*.

In an aspect of the method 800, the laser beam from the first laser processing step and the second laser processing step is applied from the first side of the wafer. As an example, referring back to FIGS. 5B and 5C, the laser beam from the first laser processing step and the second laser processing step is applied from a bottom side of the wafer 501.

In an aspect of the method 800, the laser beam from the first laser processing step and the second laser processing step is applied from a second side of the wafer. In some examples, the second side is opposite to the first side. In some examples, the second side comprises a device area.

Optionally, the method 800 may further include polishing the first side of the wafer to remove modified (e.g., stealth dicing) layers.

At 808, the method 800 may include expanding the dicing tape in a second direction to divide the wafer from the modified layer along at least the first projected dicing line and the second projected dicing line into PIC chips. In some examples, the second direction is perpendicular to the first direction.

As an example, referring back to FIG. 5D, the dicing tape is expanded radially (e.g., in a horizontal direction) to divide the wafer from the modified layer along at least the first and second projected dicing lines to form diced chips or dies 513*a*, 513*b*, 513*c*, 513*d*, 513*e*, 513*f*, 513*g* with smooth and precise PIC facets. The resulting diced chips or dies 513*a*, 513*b*, 513*c*, 513*d*, 513*e*, 513*f*, 513*g* are produced with high accuracy and more precise locations of facets as compared to similar methods of facet preparation. In addition, the facet preparation method as disclosed in the present disclosure is highly scalable such that PIC chips may be quickly mass produced while still ensuing that the PIC chips are flat and have smooth facets for edge coupling of the PICs. In some examples, the resulting PIC chips may now be placed into the ion trap (e.g., trap 270) itself.

Optionally, the method 800 may further include performing a third laser processing step to form a modified layer inside a wafer by applying a laser beam to the wafer along a third projected dicing line in the second direction to define a third facet. In some examples, the third projected dicing line is perpendicular to the first projected dicing line and the second projected dicing line.

Optionally, the method 800 may further include performing a fourth laser processing step to form the modified layer inside the wafer by applying the laser beam to the wafer along a fourth projected dicing line in the second direction to define a fourth facet. In some examples, the fourth projected dicing line is parallel to the third projected dicing line.

Figure 9:
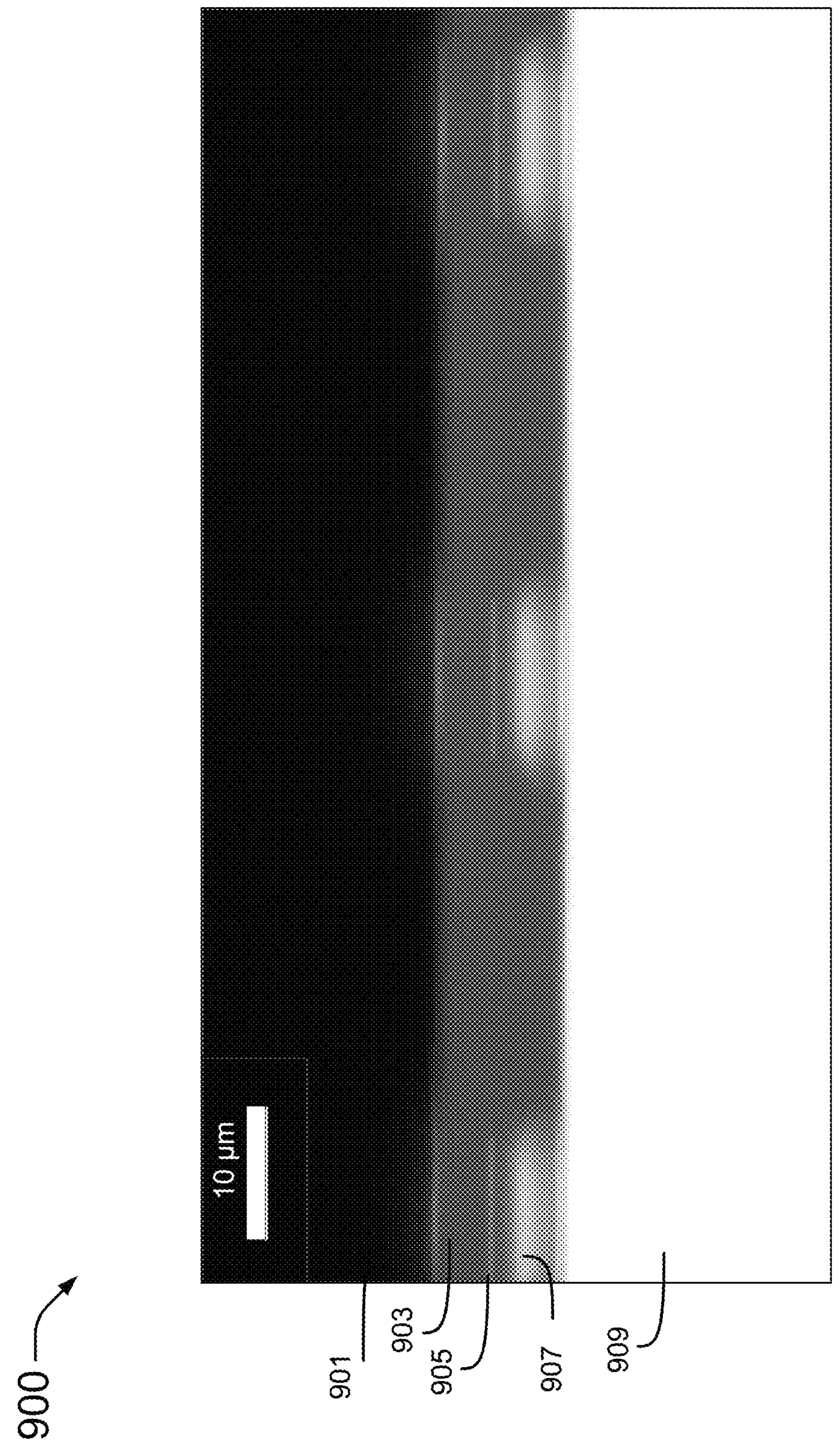
FIG. 9 illustrates an example of a cross-sectional view showing a PIC chip facet in accordance with aspects of this disclosure.

FIG. 9 illustrates an example of a cross-sectional view showing a PIC chip facet in accordance with aspects of this disclosure. Example 900 shows a result of stealth dicing of a silicon (Si) wafer 909 with PICs consisting of a single silicon nitride (SiN) core layer 905 cladded above and below by silicon dioxide ($SiO_2$) 903. The layer directly below the lower $SiO_2$ cladding is a metal layer 907, which is out of focus in FIG. 9. Specifically, example 900 shows a chip with different deposited materials including $SiO_2$ 903, SiN core layer 905, a metal layer 907, and Si wafer 909. The region 901 is free space above the chip. Other features seen in FIG. 9 are imaging artifacts.

Figure 10A:
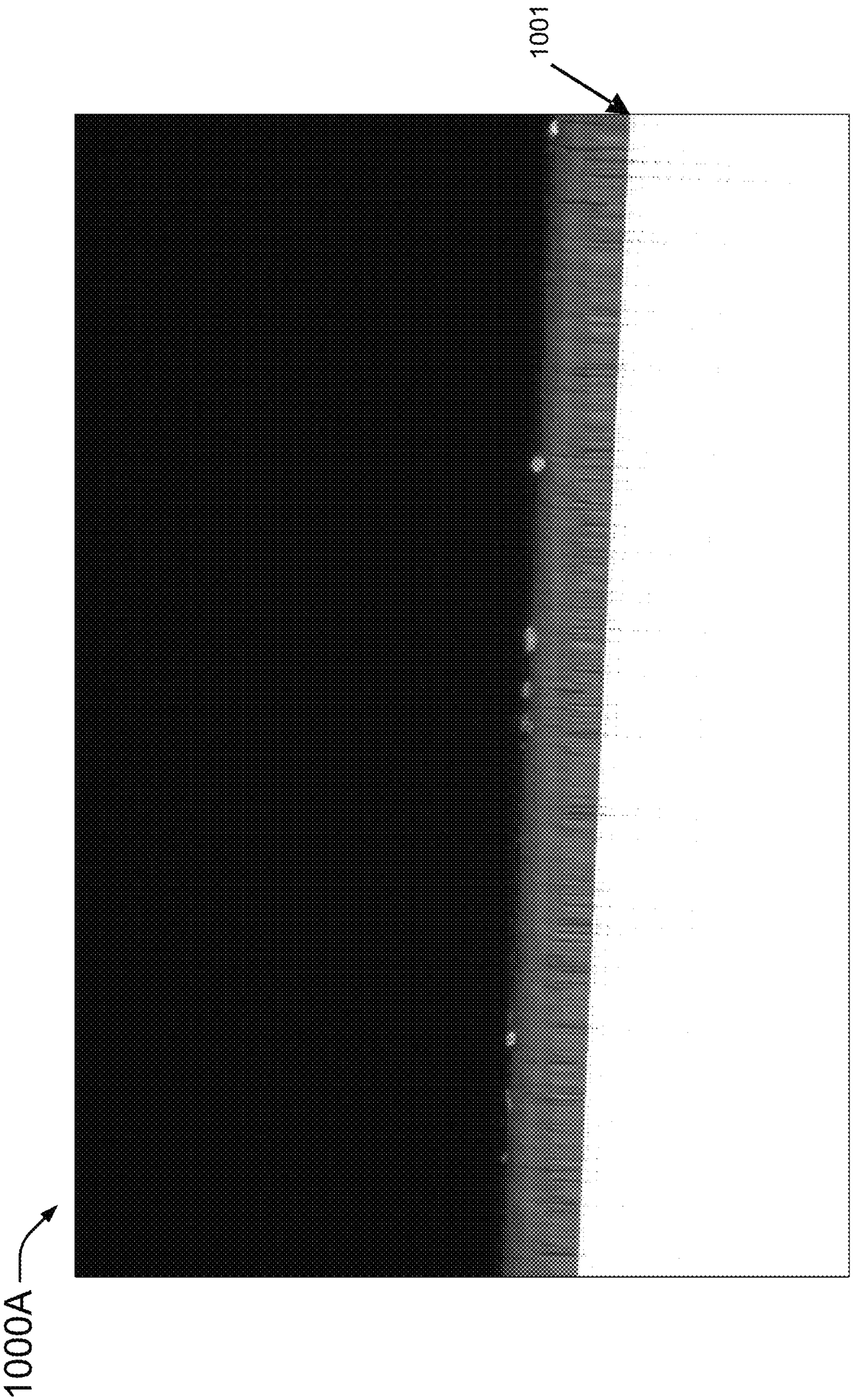
FIG. 10A illustrates an example of a cross-sectional view showing a PIC chip created using a physical dicing in accordance with aspects of this disclosure.

FIG. 10A illustrates an example of a cross-sectional view showing a PIC chip created using a combination of physical dicing in accordance with aspects of this disclosure, as well as reactive ion etching (RIE). Specifically, example 1000A shows a cross-section surface of a PIC chip with a rough surface 1001 caused by the physical (blade) dicing (e.g., etched facets) from an aluminum oxide ($Al_2O_3$) material platform. $Al_2O_3$ is a ceramic material commonly used in thin film form in various electronics, photonics, and MEMs application. It may be deposited using techinques such as Atomic Layer Deposition (ALD) or Low-Pressure Chemical Vapor Deposition Silicon Nitride (LPCVD).

Figure 10B:
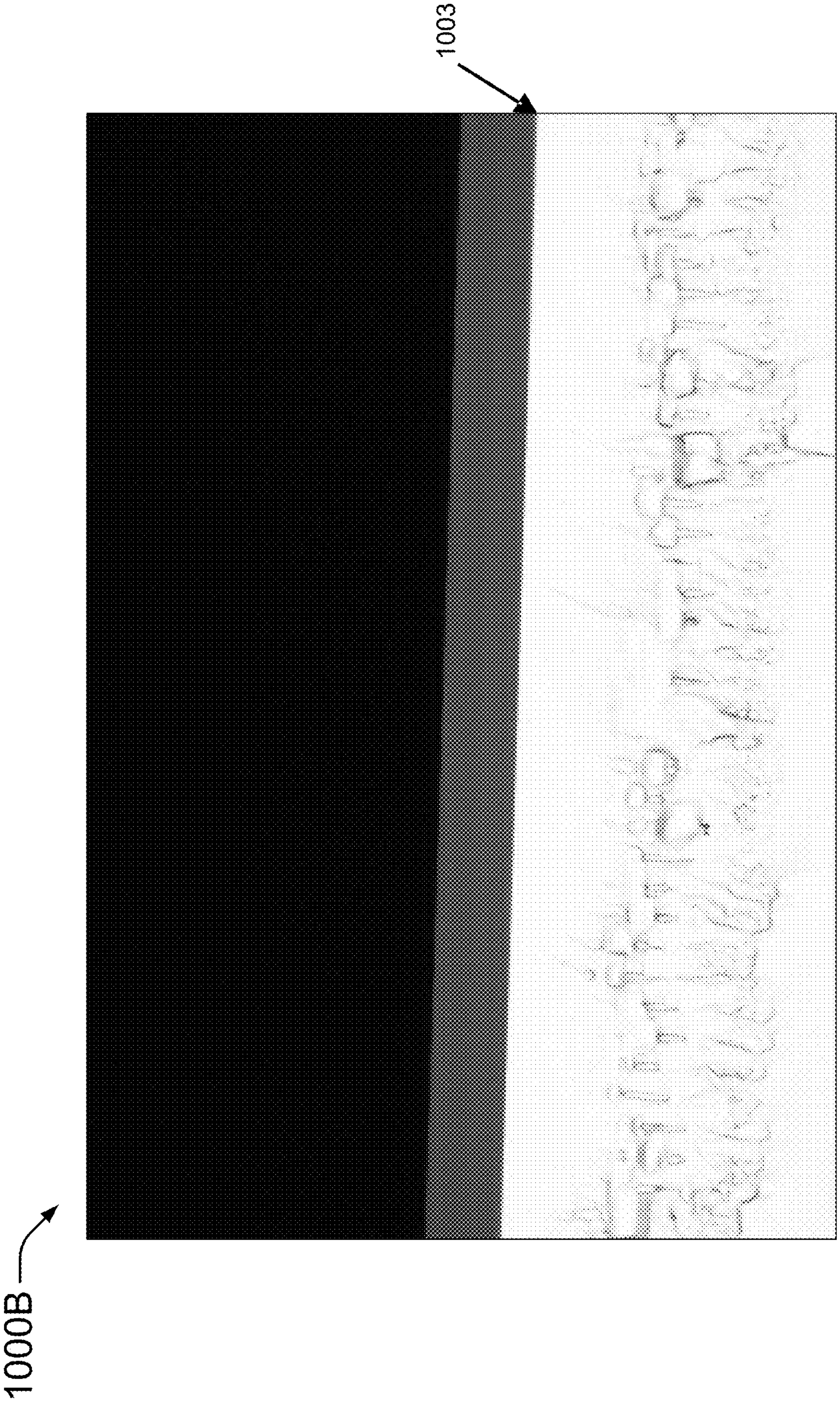
FIG. 10B illustrates an example of a cross-sectional view showing a PIC chip created using a stealth dicing in accordance with aspects of this disclosure.

FIG. 10B illustrates an example of a cross-sectional view showing a PIC chip created using a stealth dicing in accordance with aspects of this disclosure. In comparison to example 1000A from FIG. 10A, example 1000B shows a cross-section surface 1003 prepared using stealth dicing with no noticeable surface roughness prepared from the $Al_2O_3$ material platform. As explained above, since stealth dicing modifies the internal part of the PIC chip, steal dicing produces a very smooth and flat surface, which is ideal for edge coupling.

Figure 10C:
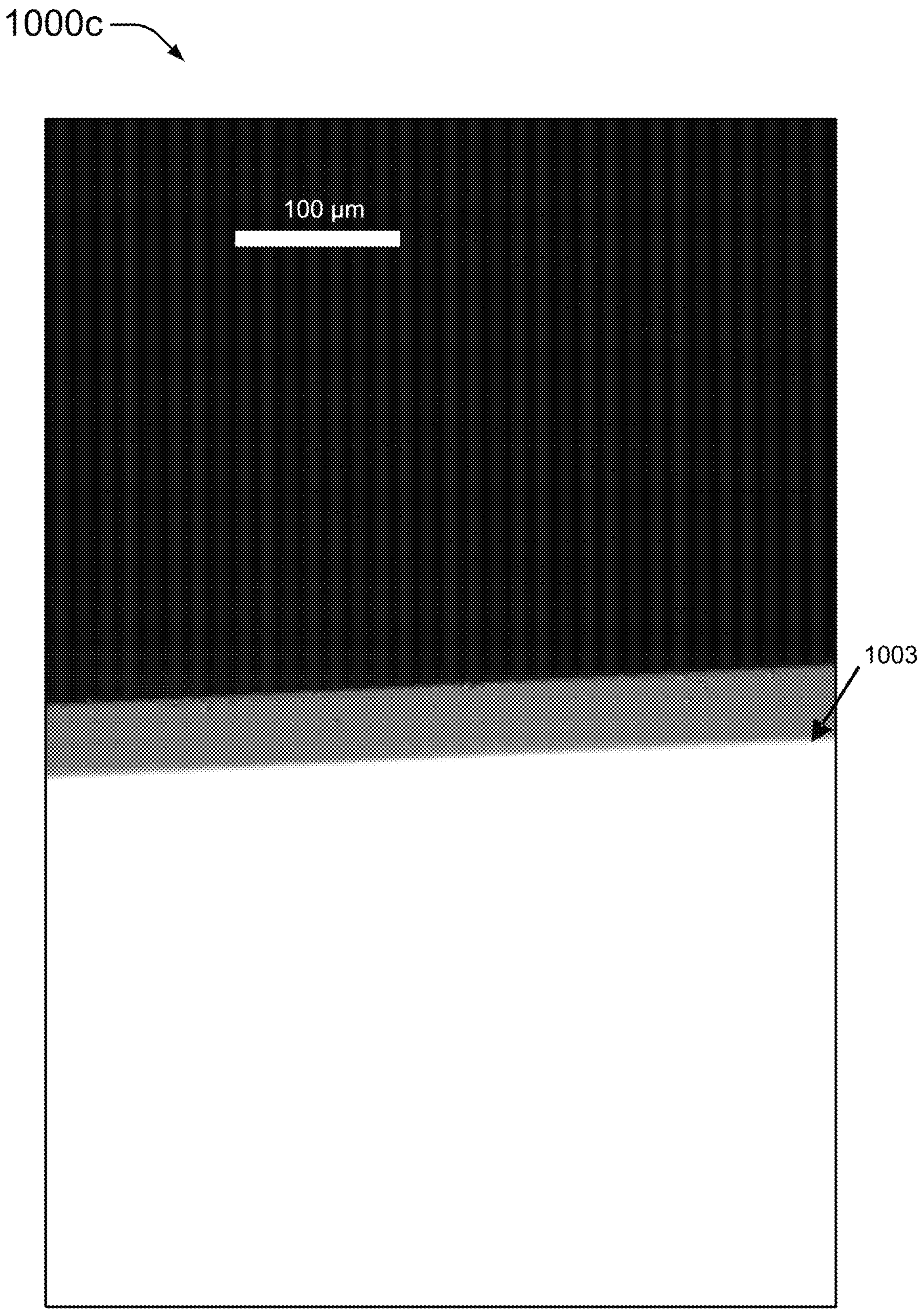
FIG. 10C illustrates an example of a cross-sectional view showing a PIC chip created using a stealth dicing in accordance with aspects of this disclosure.

FIG. 10C illustrates an example of a cross-sectional view showing a PIC chip created using a stealth dicing in accordance with aspects of this disclosure. Specifically, example 100C shows a cross-section surface 1003 prepared by stealth dicing with no noticeable surface roughness from a LPCVD Silicon Nitride ($SIN_x$) material platform. LPCVD $SIN_x$ refers to silicon nitride films deposited using the LPCVD process. LPCVD is a widely used technique in semiconductor and microfabrication industries to deposit thin films with high uniformity and excellent step coverage.

Figure 11:
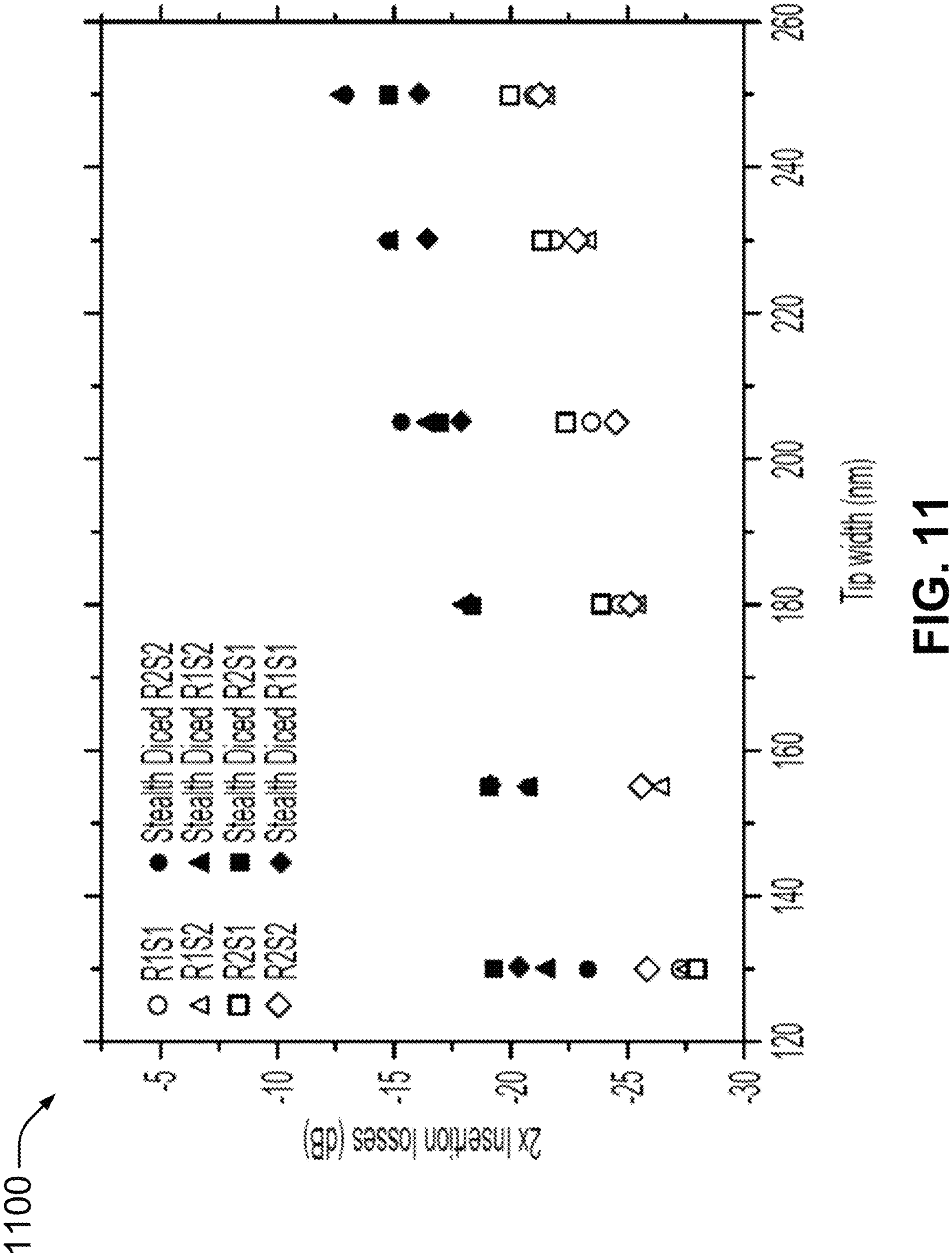
FIG. 11 illustrates a diagram comparing physical dicing vs. stealth dicing.

FIG. 11 illustrates a diagram comparing physical dicing and RIE vs. stealth dicing. Specifically, example 1100 shows a comparison of insertion losses, of light at a wavelength of 405 nm from a fiber onto the PIC chip, between a PIC chip created using physical dicing (blade) plus RIE and a PIC chip created using stealth dicing. As is evident from FIG. 11, stealth dicing generates much less insertion losses in a PIC chip than physical dicing plus RIE.

This disclosure provides a technique to prepare facets with a high accuracy and at precise locations to enable accurate and precise facet sidewall angles in a way that may be performed quickly. In addition, this process produces little to no debris in order to protect sensitive surfaces, such as the facets themselves. The goal is to utilize these technique described above to be scalable and accurate to enable wafer-scale PIC chip facet preparation. With this approach, PIC chips can have facets with low surface roughness and high surface flatness. In addition, the facets may have accurate and precise facet sidewall angles.

Is it to be understood that while this disclosure describes a technique to prepare facets on PICs based on silicon photonics, the disclosure need not be so limited. The techniques or approach described herein is also applicable to be used on PICs based on any other photons that operate at any wavelengths. The technique is particularly beneficial to wavelengths below infrared because reduced surface roughness is much more beneficial to wavelengths below infrared.

The previous description of the disclosure is provided to enable a person skilled in the art to make or use the disclosure. Various modifications to the disclosure will be readily apparent to those skilled in the art, and the common principles defined herein may be applied to other variations without departing from the scope of the disclosure. Furthermore, although elements of the described aspects may be described or claimed in the singular, the plural is contemplated unless limitation to the singular is explicitly stated. Additionally, all or a portion of any aspect may be utilized with all or a portion of any other aspect, unless stated otherwise. Thus, the disclosure is not to be limited to the examples and designs described herein but is to be accorded the widest scope consistent with the principles and novel features disclosed herein.

What is claimed is:

1. A method for preparing photonic integrated circuits (PICs), comprising:

coupling a dicing tape to a first side of a wafer;

performing a first laser processing step to form a modified layer by applying at least one laser beam of a wavelength that has transmissivity through the wafer along a first projected dicing line in a first direction to define a first facet;

performing a second laser processing step to form the modified layer by applying the at least one laser beam to the wafer along a second projected dicing line in the first direction to define a second facet, wherein the second projected dicing line is parallel to the first projected dicing line, wherein the first projected dicing line defines a first boundary of a first PIC chip and the second projected dicing line defines a second boundary of a second PIC chip facing the first PIC chip; and expanding the dicing tape in a second direction to divide the wafer from the modified layer along at least the first projected dicing line and the second projected dicing line into PIC chips, wherein the second direction is perpendicular to the first direction.

2. The method of claim 1, wherein the at least one laser beam from the first laser processing step and the second laser processing step is applied from the first side of the wafer.

3. The method of claim 2, further comprising polishing the first side of the wafer.

4. The method of claim 1, wherein the at least one laser beam from the first laser processing step and the second laser processing step is applied from a second side of the wafer, wherein the second side comprises a device area, wherein the second side is opposite to the first side.

5. The method of claim 4, wherein the second projected dicing line is approximately 300 microns from the first projected dicing line.

6. The method of claim 1, further comprising:

performing a third laser processing step by applying the at least one laser beam to the wafer along a third projected dicing line in the second direction to define a third facet, wherein the third projected dicing line is perpendicular to the first projected dicing line and the second projected dicing line.

7. The method of claim 6, further comprising:

performing a fourth laser processing step applying the at least one laser beam to the wafer along a fourth projected dicing line in the second direction to define a fourth facet, wherein the fourth projected dicing line is parallel to the third projected dicing line.

* * * * *